United States Patent

Shimada et al.

[11] Patent Number: 6,087,597
[45] Date of Patent: *Jul. 11, 2000

[54] CONNECTING MEMBER AND A CONNECTING METHOD WITH BALL AND TAPERED VIA

[75] Inventors: Yuzo Shimada; Yoshimasa Tanaka; Shinichi Hasegawa; Takayuki Suyama, all of Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/505,847

[22] Filed: Jul. 24, 1995

[30] Foreign Application Priority Data

Jul. 22, 1994 [JP] Japan ..................................... 6-170624
Sep. 30, 1994 [JP] Japan ..................................... 6-236530

[51] Int. Cl.[7] ........................................................ H01R 9/09
[52] U.S. Cl. ........................... 174/263; 438/613; 361/768; 361/779; 257/780; 228/180.22
[58] Field of Search ..................................... 174/263, 262, 174/261, 250, 255; 438/613; 361/779, 773, 774, 768; 257/779, 780, 781, 784, 786; 228/179.1, 180.1, 180.21, 180.22

[56] References Cited

U.S. PATENT DOCUMENTS

| | | | |
|---|---|---|---|
| 3,148,310 | 9/1964 | Feldman ................................... | 174/265 |
| 4,987,100 | 1/1991 | McBride et al. ......................... | 437/206 |
| 5,048,744 | 9/1991 | Chang et al. ............................ | 228/123 |
| 5,203,075 | 4/1993 | Angulas et al. .......................... | 29/830 |
| 5,261,155 | 11/1993 | Angulas et al. .......................... | 29/830 |
| 5,303,862 | 4/1994 | Bross et al. .............................. | 228/175 |
| 5,401,911 | 3/1995 | Anderson et al. ....................... | 174/262 |
| 5,448,114 | 9/1995 | Kondoh et al. .......................... | 257/778 |
| 5,844,316 | 12/1998 | Mallik et al. ............................ | 257/738 |

FOREIGN PATENT DOCUMENTS

| | | |
|---|---|---|
| 0 084 464 | 7/1983 | European Pat. Off. . |
| 0 582 052 A1 | 2/1994 | European Pat. Off. . |
| 6334936 | 2/1988 | Japan . |
| 1307236 | 12/1989 | Japan . |
| 2 067011A | 7/1981 | United Kingdom . |

*Primary Examiner*—Hyung-Sub Sough
*Assistant Examiner*—Kamand Cuneo
*Attorney, Agent, or Firm*—McGinn & Gibb, P.C.

[57] ABSTRACT

An electronic device assembly (and method for forming the same) including a first substrate having a first surface, a second surface, and a first pad on the first surface thereof; a second substrate having a first surface, a second surface, and a second pad on the second surface thereof, the first pad facing the second pad; a rigid spherical core interposed between the first and second pads; and solder connecting the first and second pads. The first substrate has a through-hole which is provided through the first substrate at a position of the first pad, at least a part of the solder is positioned in the through-hole and at least a part of the spherical core is received in the through-hole. The through-hole has an inner wall which is continuously tapered from the first surface of the first substrate to the second surface of the first substrate.

17 Claims, 6 Drawing Sheets

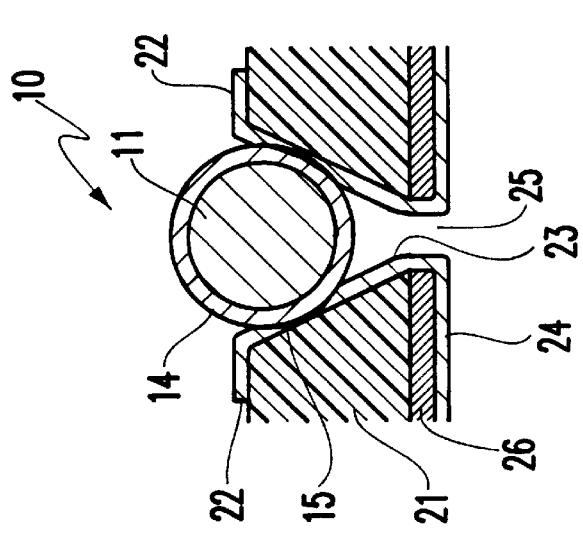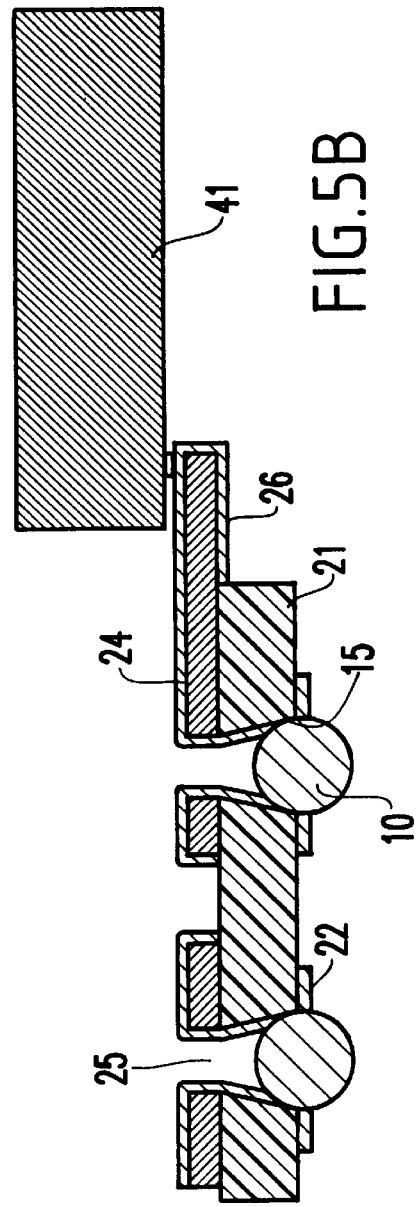

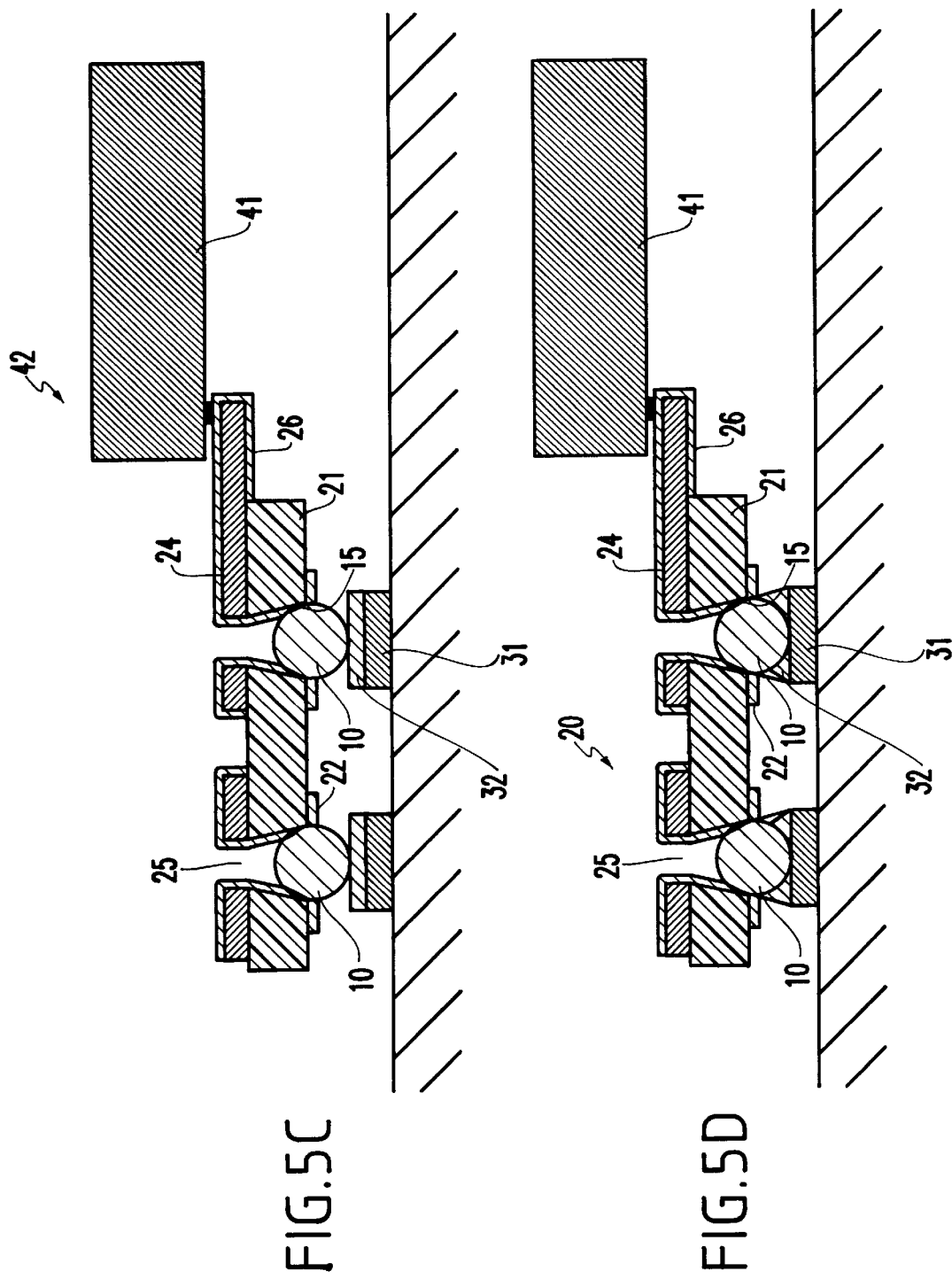

CONNECTING MEMBER AND A CONNECTING METHOD WITH BALL AND TAPERED VIA

BACKGROUND OF THE INVENTION

The present invention relates to a connecting member for connecting electronic devices, and more particularly to a connecting member for connecting pads facing each other.

A conventional technique for connecting a flexible substrate and a mounting substrate is disclosed in U.S. Pat. No. 5,261,155.

Referring to FIG. 6 of the reference, a solder member 32 and a solder paste 27 connect conductor 39 of a flexible substrate 31 and a conductive pad 23 of a substrate 13. The solder member 32 and the solder paste 27 form a solder bump.

Referring to FIGS. 4 and 5 of U.S. Pat. No. 5,261,155, the flexible substrate 31 and the substrate 13 are connected by the following steps.

In a first step, the solder paste 27 is provided on the conductive pad 23 of the substrate 13.

In a second step, the solder member 32 is positioned on the solder paste 27. Thereafter, the flexible substrate 31 is positioned so that the conductor 39 faces the solder member 32.

In a third step, the solder member 32 and the solder paste 27 are heated to melt and connect the conductor 39 and the conductive pad 23.

Referring to FIG. 9, the reference further discloses a through-hole provided in the flexible substrate 31. The through-hole is not tapered.

The aforementioned conventional structure has the following problems.

First, the heights of the bumps (i.e., the gap between the conductor 39 and the conductive pad 23) vary with the positions thereof when the flexible substrate 31 warps, and thus become uneven and have a nonuniform height.

Second, when the flexible substrate 31 is pressed against the substrate 13 during heating to enhance the flatness thereof, the solder member 32 and the solder paste 27 are squeezed. The squeezed solder member 32 and solder paste 27 spreads over the substrates 31 and 13, thereby short-circuiting conductor patterns provided on the substrates.

The above-mentioned first and second problems are especially serious when the conventional technique is applied to a fine pitch soldering.

Third, the mechanical strength of the solder bump is weak.

Fourth, a faulty connection of the solder bump is not easily detected because the solder bump is obscured under the flexible substrate 31.

Fifth, when the flexible substrate 31 is pressed against the substrate 13, the squeezed solder spreads over the upper surface of the flexible substrate 31 via the through-hole.

SUMMARY OF THE INVENTION

In view of the aforementioned problems of the conventional connecting technique, a first object of the present invention is to provide a connecting member for forming solder bumps with uniform height.

A second object of the present invention is to avoid squeezing the solder bumps when the substrates are pressed against each other.

A third object of the present invention is to enhance the mechanical strength of the solder bumps.

A fourth object of the present invention is to make it easier to detect a connection failure.

A fifth object of the present invention is to avoid solder from spreading over the upper surface of the flexible substrate 31 via the through-hole when the flexible substrate 31 is pressed against the substrate 13.

A sixth object of the present invention is to enhance the reliability of fine pitch soldering.

According to the present invention, a connecting member comprises a core having a first melting point and solder covering the core and having a second melting point. The second melting point is lower than the first melting point. The core may have a substantially spherical shape.

According to the present invention, an electronic device assembly comprises a first substrate, a second substrate, and a core. The first substrate has a first surface, a second surface, and a first pad on the first surface thereof. The second substrate has a first surface, a second surface, and a second pad on the second surface thereof. The first pad faces the second pad. The core is substantially spherical and interposed between the first and second pads. The first and second pads are connected by a solder.

The first substrate may have a through-hole at a position of the first pad, and at least a part of the solder is positioned in the through-hole. The through-hole may be tapered.

The first and second substrates may be connected by the following steps. In a first step, a first pad is formed on a surface of the first substrate. In a second step, a second pad is formed on a surface of the second substrate. In a third step, a connecting member is prepared. The connecting member includes a substantially spherical core and solder covers the core. The core and the solder have first and second melting points, respectively. The first melting point is higher than the second melting point. In a fourth step, a solder paste is provided on the second pad of the second substrate. In a fifth step, the connecting member is positioned on the solder paste. In a sixth step, the first substrate is positioned so that the first pad faces the connecting member. In an eighth step, the connecting member and the solder paste are heated at temperatures between the first and second melting points. The solder paste and the solder of the connecting member melts to connect the first and second pads.

In the first step, a through-hole may be bored in the first substrate at a position of the first pad. At least one of the solder paste and the solder of the connecting member flows into the through-hole. A faulty connection can be detected by confirming whether at least a portion of the solder paste and the solder of the connecting member is protruding from the through-hole of the first substrate.

BRIEF DESCRIPTION OF THE DRAWINGS

Other objects, features and advantages of the present invention will become more apparent when the following description is read in conjunction with the accompanying drawings, wherein:

FIGS. 5(a) to 5(d) show the structure and the manufacturing process of an electronic device assembly according to a third embodiment of the present invention.

In these drawings, the same reference numerals depict the same parts, respectively.

DETAILED DESCRIPTION OF THE PREFERRED EMBODIMENTS

Next is described the first embodiment of the present invention. The first embodiment relates to a connecting member.

Figure 1:
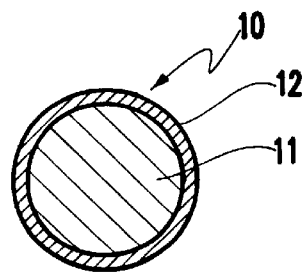
FIG. 1 is a cross-section of a connecting member according to a first embodiment of the present invention.

Referring to FIG. 1, a connecting member 10 has a core 11 having a substantially spherical shape and solder 12 covering the core 11.

The diameter of the core 10 is approximately 300 $\mu$m. The thickness of the solder 12 is approximately 5 to 10 $\mu$m.

The core 11 is formed from metal (unitary or an alloy) or ceramic. The melting point of the core 11 must be higher than that of the solder 12.

In the case of metals, the material of the core 11 is preferably selected from a group comprising copper, iron, nickel, chromium, tungsten, molybdenum, silver and alloys of at least two of the preceding metals.

In the case of ceramics, the material of the core 11 may be alumina, glass, zirconia, or silica.

The material of the solder 12 may be tin, gold/tin alloy, or tin/lead solder. Such solder is known in the art and is commercially available.

Next is described the second embodiment of the present invention. The second embodiment relates to an electronic device assembly incorporating the connecting member 10 and the manufacturing process thereof.

Figure 2:
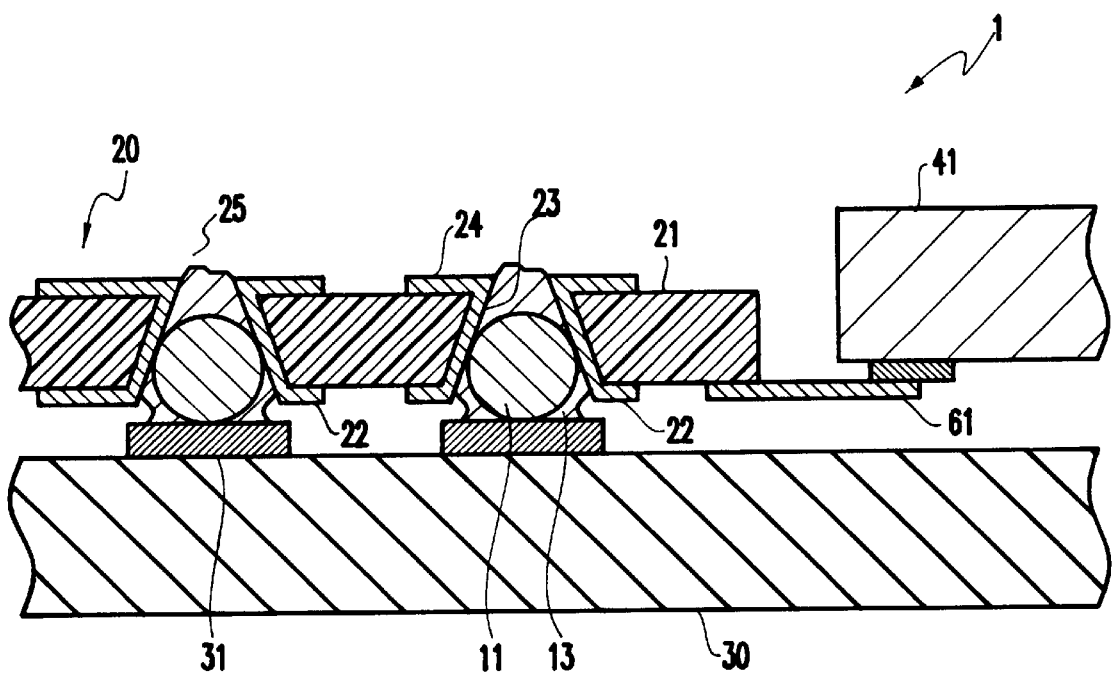
FIG. 2 shows the structure of an electronic device assembly according to a second embodiment of the present invention.

Referring to FIG. 2, an electronic assembly 11 comprises a large-scale-integrated (LSI) chip 41, a tape carrier 20 and substrate 30. The tape carrier 20 and the substrate 30 are connected via the core 11 and solder 31.

In the exemplary embodiment, the LSI chip 41 is square shaped having a length of approximately 17.5 mm. The LSI chip 41 has 800 terminals along each of the sides thereof. The terminals are aligned with an 80 $\mu$m pitch. The terminals are connected to the tape carrier 20 via inner leads 61.

The tape carrier 20 includes an insulating film 21. The thickness of the insulating film 21 is approximately 50 $\mu$m. The insulating film 21 is formed from a material having suitable heat resistance and a relatively low thermal expansion coefficient. The insulating film 21 is preferably easily attachable to conductor patterns. Specifically, the insulating film 21 is preferably formed from a polyimide or benzocyclobutene (BCB).

The insulating film 21 has a through-hole 25. A conductor pattern 23 is formed on the inner surface of the through-hole 25. A conductor pattern 24 and a pad 22 are formed on the upper and lower surfaces of the insulating film 21, respectively, and are connected to each other via the conductor pattern 23. The thickness of the pad 22, and the conductor patterns 23 and 24 are approximately 10 to 25 $\mu$m. The pad 22 and the conductor pattern 24 are annular and have outer diameters of about 500 $\mu$m and 250 $\mu$m, respectively. The pad 22 and the conductor patterns 23 and 24 are formed from copper and are plated with gold.

The through-hole 25 is tapered. Specifically, the diameter of the through-hole 25 is set to approximately 150 $\mu$m and 300 $\mu$m at upper and lower surfaces of the insulating film 21, respectively.

The substrate 30 has a pad 31 on the upper surface thereof. The pad 31 is circular, having a diameter of about 600 $\mu$m. The pads 22 and 31 are connected by solder 13. The core 11 is interposed between the pads 22 and 31.

The material and the dimension of the core 11 are the same as those of the first embodiment. The upper portion of the core 11 is received in the through-hole 25 and comes into contact with the conductor pattern 23. The connecting member 10 can easily be received in the through-hole 25 because the core 11 is spherical and the through-hole 25 is tapered. The lower end of the core 11 is placed on the pad 31. The core 11 supports the tape carrier 20 on the substrate 30.

A part of the solder 13 is placed in the through-hole 25. The upper end of the solder 13 protrudes from the through-hole 25 and appears on the upper surface of the tape carrier 20.

Next is described a first method for connecting the tape carrier 20 and the substrate 30.

Figure 3A:
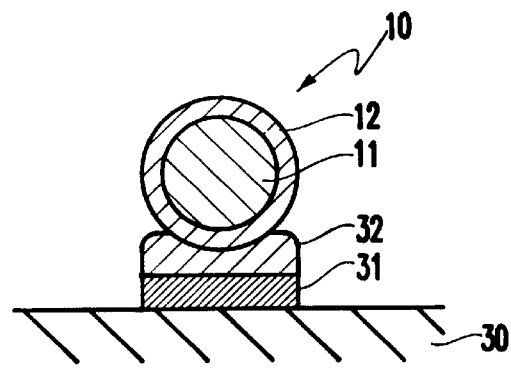
FIGS. 3(a) to 3(d) illustrate steps of a first method for connecting a tape carrier 20 and a substrate 30 shown in FIG. 2.

Referring to FIG. 3(a), in a first step, a solder paste 32 is provided on the pad 31. The thickness of the solder paste 32 is approximately 150 to 250 $\mu$m. Thereafter, the connecting member 10 is placed on the solder paste 32. The connecting member 10 remains on the solder paste 32 due to adhesion of the solder paste 32.

Figure 3B:
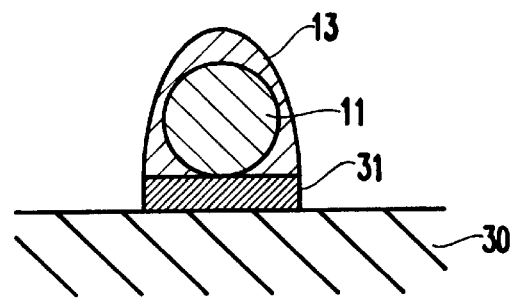

Referring to FIG. 3(b), in a second step, the connecting member 10 and the solder paste 32 are heated at a temperature between the melting points of the solder 12 and the core 11. The solder 12 and solder paste 32 melt to form solder 13, while the core does not melt. Thereafter, the solder 13 is cooled to form a solder bump including the core 11.

Figure 3C:
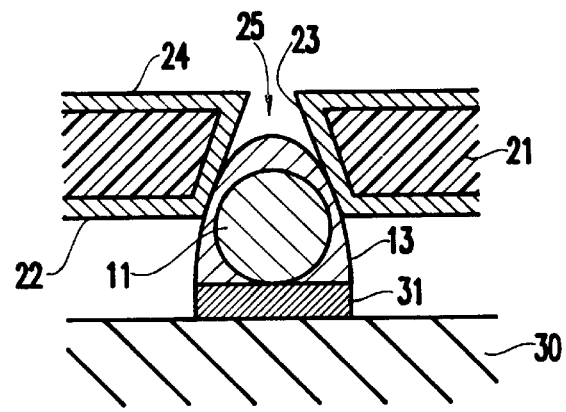

Referring to FIG. 3(c), in a third step, the tape carrier 20 is positioned so that the through-hole 25 is placed over the solder 13.

Figure 3D:
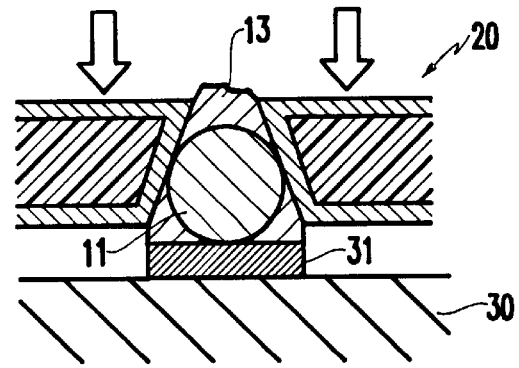

Referring to FIG. 3(d), in a fourth step, the solder 13 is heated and melts to flow into the through-hole 25, while the core 11 does not melt and supports the tape carrier 20. A part of the solder 13 appears at the upper surface of the tape carrier 20. The faulty connection of the solder 13 (and thus the electronic device) can easily be detected by confirming whether or not at least a portion of the solder 13 protrudes from the through-hole 25. A faulty connection exists when such a solder portion does not protrude from the through-hole 25. This soldering makes a uniform gap between the tape carrier 20 and the substrate 30 because the gap is determined by the diameter of the core 11.

Next is described a second method for connecting the tape carrier 20 and the substrate 30.

Figure 4A:
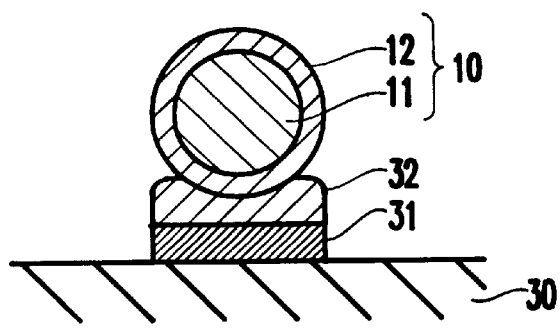
FIGS. 4(a) to 4(c) illustrate steps of a second method for connecting a tape carrier 20 and a substrate 30 shown in FIG. 2.

Referring to FIG. 4(a), a first step of the second method is the same as that of the first method.

Figure 4B:
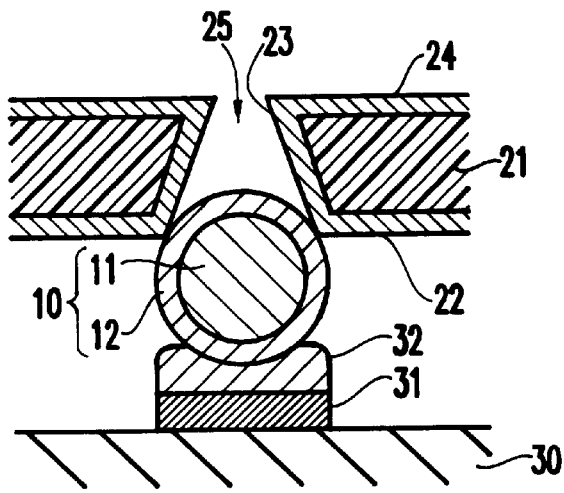

Referring to FIG. 4(b), in a second step, the tape carrier 20 is positioned so that the through-hole 25 is placed over the connecting member 10.

Figure 4C:
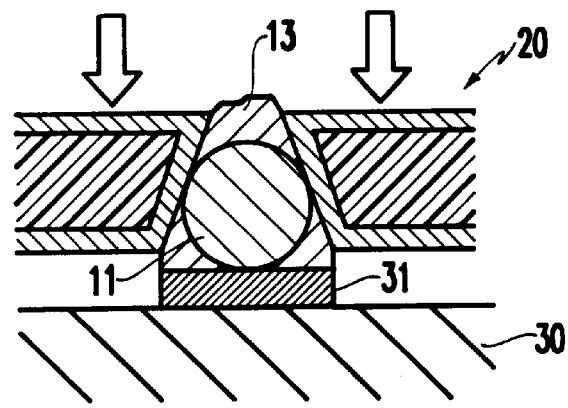

Referring to FIG. 4(c), in a third step, the connecting member 10 and the solder paste 32 are heated at a temperature between the melting points of the solder 12 and the core 11. The solder 11 and solder paste 32 melt to form solder 13 and flow into the through-hole 25, while the core does not melt and supports the tape carrier 20.

A part of the solder 13 appears at the upper surface of the tape carrier 20. The faulty connection of the solder 13 can easily be detected by confirming whether or not at least a portion of the solder 13 protrudes from the through-hole 25.

In the fourth step of the first method and the third step of the second method, the tape carrier 20 may be pressed against the substrate 30 to enhance the evenness (e.g., flatness) of the tape carrier 20. The tape carrier 20 may also be pressed slightly against the substrate 30 to enhance the flow of the solder 13.

Next is described the technical advantages of the second embodiment.

First, the height of the bump or the gap between the tape carrier 20 and the substrate 30 can be adjusted precisely and uniformly because the gap is defined by the core 11.

Second, when the tape carrier 20 is pressed against the substrate 30, the solder 13 is not squeezed because the core 11 supports the tape carrier 30.

Third, the mechanical strength of the solder bump is enhanced because the solder bump includes the core 11.

Fourth, the pad 22 can be positioned precisely over the pad 31 because the connecting member 11 is received by the through-hole 25 to precisely position the pad 22.

Fifth, the faulty connection of the solder 13 can easily be detected by confirming whether or not a portion of the solder 13 protrudes from the through-hole 25.

Sixth, when the tape carrier 20 is pressed against the substrate 30, the squeezed solder 13 does not spread over the upper surface of the tape carrier 20 because the core 11 supports the tape carrier 20.

Next is described the third embodiment of the present invention. The third embodiment relates to an electronic assembly incorporating the connecting member 10 and the manufacturing method thereof.

Referring to FIG. 5 (d), an electronic device assembly of the third embodiment comprises the same LSI chip 41 as that of the second embodiment.

A conductive pattern 26 is formed on the upper surface of the insulating film 21. The material of the insulating film 21 is the same as that of the second embodiment.

A conductive pattern 24 is formed on the conductive pattern 26. A pad 22 is formed on the lower surface of the insulating film 21. A conductive pattern 23 is formed on the inner surface of the through-hole 25. The pad 22 and the conductive patterns 23 and 24 are formed by gold plating. The pad 22 and the conductive patterns 23 and 24 can also be formed by copper plating and subsequent gold plating on the copper plating.

The connecting member 10 is received in the through-hole 25 and connected to the conductive pattern 23. If the diameter of the core 11 is large enough, the connecting member 10 is not received in the through-hole and connected to the pad 22. The connecting member 10 includes the core 11 and a gold/tin alloy 14 as the solder 12. The lower end of the connecting member 10 is connected to the pad 31 by solder 32.

Next is described a method for connecting the tape carrier 20 and the substrate 30.

Referring to FIG. 5(a), in a first step, the connecting member 10 is placed in the through-hole 25. The gold/tin alloy 14 comes into contact with the conductive pattern 23.

The connecting member 10 is heated at temperatures between approximately 300 to 350° C. in an atmosphere of nitrogen for about 10 minutes. The insulating film 21 is not damaged by the heating because the decomposition temperature of the polyimide is more than 400° C.

The eutectic temperature of the gold/tin alloy is around 280° C. Therefore, the heating causes a reaction between the gold plated on the conductive pattern 23 and the gold/tin alloy 14 to connect the connecting member 10 and the conductive pattern 23.

Referring to FIG. 5(b), the tape carrier 20, the LSI chip 41 and the connecting member 10 form an electronic device carrier 42.

Referring to FIG. 5 (c), in a second step, a solder paste is provided on the pad 31. The electronic device carrier 42 is positioned so that the connecting member 10 is placed on the solder paste 32.

Referring to FIG. 5(d), in a third step, the solder paste 32 and the connecting member 10 are heated. The solder paste 32 and the gold/tin alloy melt and connect the connecting member 10 and the pad 31.

The third embodiment has the aforementioned first to fifth advantages of the second embodiment.

Next is described the fourth embodiment of the present invention. The fourth embodiment relates to an electronic device carrier incorporating the connecting member 10 and the manufacturing process thereof.

Figure 6:
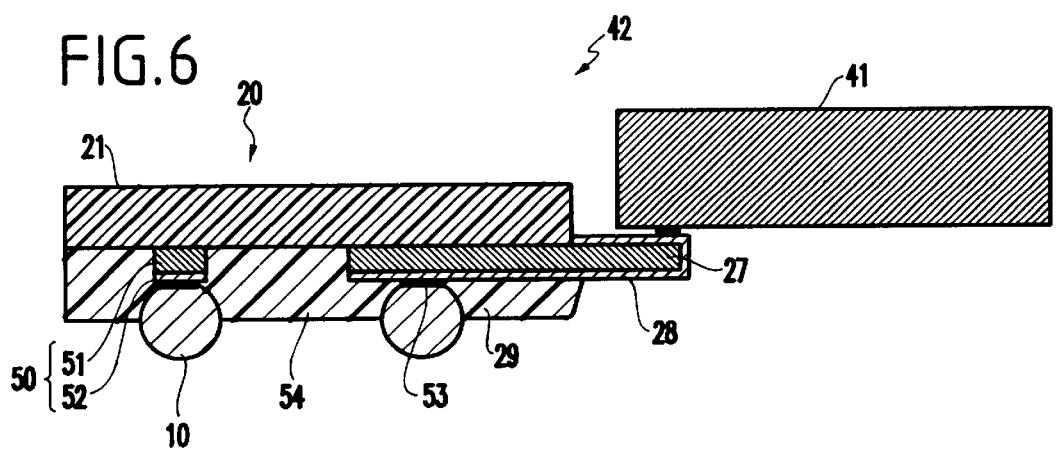
FIG. 6 shows the structure of an electronic device assembly according to a fourth embodiment of the present invention.

Referring to FIG. 6, an electronic device carrier 42 according to the fourth embodiment comprises the LSI chip 41. The structure of the LSI chip 41 is the same as that of the second embodiment.

A conductive pattern 27 is formed on the lower surface of the insulating film 21. The conductive pattern 27 is plated with gold 28. A portion of the conductive pattern 27 serves as an inner lead and is connected to the LSI chip 41.

A pad 50 is formed on the lower surface of the insulating film 21. The pad 50 includes a conductive pattern 51 plated with gold layer 52. The pad 50 is connected to the conductive pattern 27. The thickness of the conductive pattern 51 and the gold layer 52 are approximately 10 to 25 $\mu$m and 1 to 5 $\mu$m, respectively.

The connecting member 10 is connected to the pad 50. A gold/tin alloy 53 is formed between the connecting member 10 and the gold layer 52.

An insulating material 29 covers the lower surface of the insulating film 21 to protect the conductive pattern 27 from damage.

Next is described a method for connecting the pad 50 and the connecting member 10.

Figure 7A:
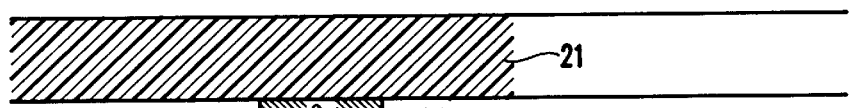
FIGS. 7(a) to 7(d) illustrate steps of a method for connecting a pad 50 and a connecting member 10 shown in FIG. 6.

Referring to FIG. 7(a), in a first step, the conductive pattern 51 is formed on the lower surface of the insulating film 21.

Figure 7B:
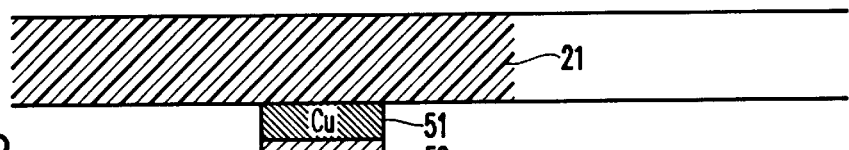

Referring to FIG. 7(b), in a second step, the conductive pattern 51 is plated with gold layer 52.

Figure 7C:
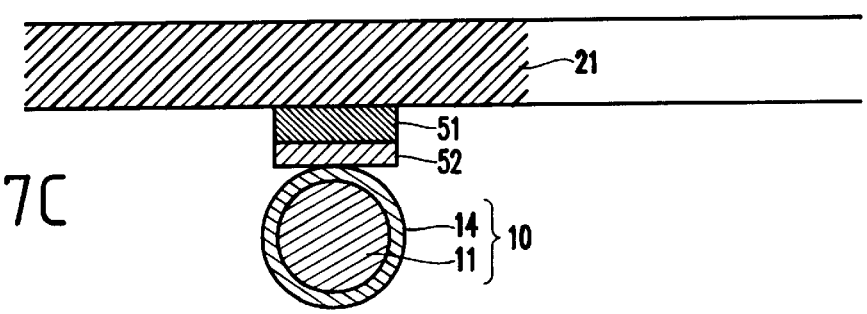
Figure 7D:
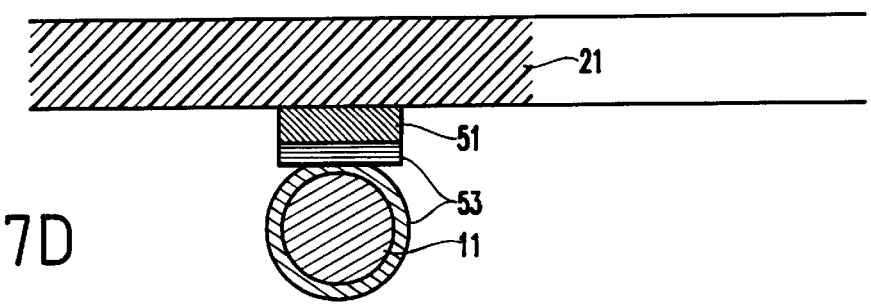

Referring to FIG. 7(c), in a third step, the connecting member 10 is pressed against the gold layer 52.

Referring to FIG. 7(c), in a fourth step, the connecting member 10 is heated at temperatures between approximately 300 to 350° C. in an atmosphere of nitrogen for about 10 minutes. The insulating film 21 is not damaged by the heating because the decomposition temperature of the polyimide is more than 400° C.

The eutectic temperature of the gold/tin alloy is around 280° C. Therefore, the heating causes a reaction between the gold layer 52 and the gold/tin alloy 14 of the connecting member 10 to form the gold/tin alloy 53. The gold/tin alloy 53 connects the connecting member 10 and the conductive pattern 52.

In the third embodiment, eutectic tin/lead solder can be used as the solder 12 instead of the gold/tin alloy 14. The melting point of the eutectic tin/lead solder is around 180° C. If the tin/lead solder is used as the solder 12, the gold/tin alloy 53 is not formed.

The fourth embodiment has the aforementioned first to fourth advantages of the second embodiment.

Next is described modifications of the present invention.

The shape of the core 11 is not limited to the spherical shape so long as the core 11 is easily received in the through-hole 25.

Thus, the core could alternatively have an oval, elliptical shape, or other similar shape easily received in the through-hole.

The present invention can be applied to substrates other than the insulating film 21.

The dimensions of the above structures are merely exemplary and the dimensions are scalable according to the designer's requirements.

The present embodiments are therefore, to be considered in all respects as illustrative and not restrictive, the scope of the invention being indicated by the appended claims rather than by the foregoing description and all changes which come within the meanings and range of equivalency of the claims are therefore intended to the embraced therein.

What is claimed is:

1. An electronic device assembly, comprising:
   a first substrate having a first surface, a second surface, and a first pad on said first surface thereof;
   a second substrate having a first surface, a second surface, and a second pad on said second surface thereof, said first pad facing said second pad;
   a rigid spherical core interposed between said first and second pads; and
   solder connecting said first and second pads,
   wherein said first substrate has a through-hole which is provided through said first substrate at a position of said first pad, and at least a part of said solder is positioned in said through-hole and at least a part of said spherical core is received in said through-hole,
   wherein said through-hole has an inner wall which is continuously tapered from said first surface of said first substrate to said second surface of said first substrate.

2. An electronic device assembly according to claim 1, wherein said first pad is aligned over said second pad by said receipt of said at least a part of said spherical core by said through-hole.

3. An electronic device assembly according to claim 1, wherein:
   said second pad has a gold plating;
   said solder comprises tin and gold; and
   an alloy which is formed by melting said solder to said gold plating.

4. An electronic device assembly according to claim 1, wherein a gap between said first substrate and said second substrate is defined by said spherical core.

5. An electronic device assembly according to claim 1, wherein a gap between said first substrate and said second substrate is defined by said spherical core and said tapered through-hole.

6. An electronic device assembly according to claim 1, wherein at least a part of said solder protrudes from said through-hole.

7. An electronic device assembly according to claim 6, wherein said solder protruding through said through-hole indicates a properly formed connection.

8. An electronic device assembly according to claim 1, wherein at least one of said first and second pads is plated with gold.

9. An electronic device assembly according to claim 8, wherein said first pad is aligned over said second pad by said receipt of said at least a part of said spherical core by said through-hole.

10. A method for connecting first and second substrates by soldering comprising:
    (a) forming a first pad on a surface of said first substrate;
    (b) forming a second pad on a surface of said second substrate;
    (c) preparing a connecting member including a substantially spherical core and solder covering said core, said core and said solder having first and second melting points, respectively, said first melting point being higher than said second melting point;
    (d) providing a solder paste on said second pad of said second substrate;
    (e) positioning said connecting member on said solder paste;
    (f) positioning said first substrate so that said first pad faces said connecting member; and
    (g) heating said connecting member and said solder paste at a temperature between said first and second melting points, said solder paste and said solder of said connecting member melting to connect said first and second pads,
    wherein said forming of said first pad further comprises a step of boring a through-hole that is continuously tapered through said first substrate at a position of said first pad, and wherein at least one of said solder paste and said solder of said connecting member flows into said through-hole.

11. A method according to claim 10, said positioning of said connecting member on said solder paste further comprising:
    heating said connecting member and said solder paste at a temperature between said first and second melting points to melt said solder paste and said solder of said connecting member; and
    cooling said solder member and said solder paste so that said solder paste, said core and said solder of said connecting member form a solder bump.

12. A method according to claim 10, wherein said core of said connecting member supports said first substrate on said second substrate.

13. A method according to claim 10, said heating further comprising pressing said first substrate against said second substrate.

14. A method according to claim 10, said forming of said first pad further comprising plating said first pad with gold.

15. A method according to claim 10, said forming of said second pad further comprising plating said second pad with gold.

16. A method according to claim 10, said heating furthers comprising confirming whether at least a portion of said solder paste and said solder of said connecting member is protruding from said through-hole of said first substrate.

17. A method for connecting first and second substrates by soldering, comprising steps of:
- (a) forming a fist pad on a surface of said first substrate;
- (b) forming a second pad on a surface of said second substrate;
- (c) preparing a connecting member including a substantially spherical core and solder covering said core, said core and said solder having first and second melting points, respectively, said first melting point being higher than said second melting point;
- (d) positioning said connecting member on said fist pad;
- (e) heating said connecting member at a temperature between said first and second melting points to connect said connecting member and said first pad;
- (f) providing a solder paste on said second pad of said second substrate;
- (g) positioning said first substrate so that said connecting member faces said second pad; and
- (h) heating said connecting member and said solder paste at a temperature between said first and second melting points, said solder paste and said solder of said connecting member melting to connect said first and second pads, wherein said forming of said first pad further comprises a step of boring a through-hole that is continuously tapered through said first substrate at a position of said first pad, and wherein at least one of said solder paste and said solder of said connecting member flows into said through-hole.

* * * * *